United States Patent [19]
Koeck

[11] Patent Number: 5,966,675
[45] Date of Patent: Oct. 12, 1999

[54] METHOD AND DEVICE FOR MONITORING POWER SUPPLY NETWORKS

[75] Inventor: Gerd Koeck, Stuttgart, Germany

[73] Assignee: Siemens Aktiengesellschaft, Munich, Germany

[21] Appl. No.: 08/793,423

[22] PCT Filed: Aug. 9, 1995

[86] PCT No.: PCT/DE95/01051

§ 371 Date: Apr. 30, 1997

§ 102(e) Date: Apr. 30, 1997

[87] PCT Pub. No.: WO96/06360

PCT Pub. Date: Feb. 29, 1996

[30] Foreign Application Priority Data

Aug. 25, 1994 [DE] Germany ............................ 44 30 246

[51] Int. Cl.⁶ .................................................. G06F 17/14
[52] U.S. Cl. ................... 702/58; 702/77; 702/64; 702/187; 702/193; 364/528.27; 324/522; 324/76.21
[58] Field of Search .............................. 702/58, 187, 59, 702/60, 64, 65, 75–77, 126, 183–185, 189, 191, 193, 198; 364/178, 179, 827, 726.03, 528.28, 528.29, 528.21, 27; 324/509, 512, 520–522, 525, 76.19, 21, 22; 361/62–69, 76–80, 81, 82, 85–87; 395/750.01

[56] References Cited

U.S. PATENT DOCUMENTS 4,855,861  8/1989  Bergman et al. ................. 364/528.29
4,878,142  10/1989  Bergman et al. .......................... 361/80
5,453,903  9/1995  Chow ......................................... 361/80
5,519,645  5/1996  Bohley ....................................... 702/76

FOREIGN PATENT DOCUMENTS 0 477 690 A1  4/1992  European Pat. Off. .
38 17 499 C1  9/1989  Germany .
WO 93/03530  2/1993  WIPO .
WO 94/22025  9/1994  WIPO .

OTHER PUBLICATIONS

K. Riedel, "Datenreduzierende Bildcodierung," 1986, Franzis'–Verlag, Munich, (No translation and no month).

N. Hesselmann, "Digitale Signalverarbeitung," 2. Auflage, 1987, Vogel–Verlag, Wuerzburg, pp. 113–118. (No translation and no month).

Primary Examiner—Hal Dodge Wachsman
Attorney, Agent, or Firm—Kenyon & Kenyon

[57] ABSTRACT

Spectral values are calculated from sampling values of the network voltage or current using the discrete Fourier transformation. Of these values, only those that are greater than a predefined threshold value (SW) are transmitted or stored. The missing spectral values are assumed to be equal to zero to reconstruct the sampling values. In general only those spectral values are transmitted or stored that pertain to a fault and its previous and subsequent history of a few seconds.

3 Claims, 3 Drawing Sheets

METHOD AND DEVICE FOR MONITORING POWER SUPPLY NETWORKS

FIELD OF THE INVENTION

The present invention relates to a method and device for monitoring a power supply network.

BACKGROUND INFORMATION

Fault recorders are used for detecting and recording faults in electrical power supply networks; said fault recorders sample the network with a frequency that is high compared to the network frequency, so that higher-frequency faults are also detected. Network faults can be detected, for example, by comparing the network voltage sampling values in successive periods. Since, on the one hand, the full signal variation cannot be recorded, since this would require a huge number of irrelevant data to be stored and, on the other hand, mere recording of a fault is in general insufficient for analysis regarding its origin and effects, the previous history a few seconds before and the subsequent variation of current and voltage for a few seconds after their decay are recorded. The sampled values can be made available in a memory or a register for later recording, or they can also be transmitted to a central unit where they are stored and analyzed. Despite limiting the method to faults and the immediate previous and subsequent history, considerable amounts of data must be stored and/or transmitted. For example, if the fault has a duration of 0.25 seconds and the 5-second previous and subsequent history are to be recorded, a recording rate of 80 Kbyte/sec results considering a sampling rate of 5 Khz, eight channels (four for voltages and four for currents), and a digitizing resolution of 16 bits. Therefore 820 Kbytes are required for describing the assumed fault during 10.25 sec. At a transmission rate of 300 Baud, their transmission would require 6 hrs, i.e., an intolerably long time. Even at a higher transmission rate of 9600 Baud, the transmission time would not be reduced to a satisfactory level.

Therefore, European Patent Application 477,690 A1 proposes that the sampling values be subjected to data reduction prior to their storage or transmission. Different data reduction methods are known from the literature, e.g., from K. Riedel's book "Datenreduzierende Bildcodierung" [Image coding for data reduction], 1986, Franzis'-Verlag, Munich.

SUMMARY OF THE INVENTION

An object of the present invention is to provide a method for monitoring power supply networks with a particularly effective data reduction. Furthermore, a device for carrying out this method is to be provided.

The present invention provides a method for monitoring a power supply network wherein a voltage or a current is cyclically sampled and the sampling values are digitized, wherein faults are detected, wherein the sampling values recorded during a fault of the voltage or the current, as well as during a time period prior and subsequent to the fault are compressed and are transmitted and/or stored and decompressed to be analyzed. In the method of the present invention, spectral values are obtained from an integer multiple of the number of sampling values spanning the network period, using a discrete Fourier transformation. The amplitudes of the spectral values are compared with a threshold value and only those spectral values that are greater than the threshold value are transmitted and/or stored. An inverse discrete Fourier transformation is performed with the transmitted spectral values and constant values that are smaller than the threshold value, preferably equal to zero, and which replace the spectral values suppressed by the comparison with the threshold value, to compress the data.

DETAILED DESCRIPTION

Figure 1:
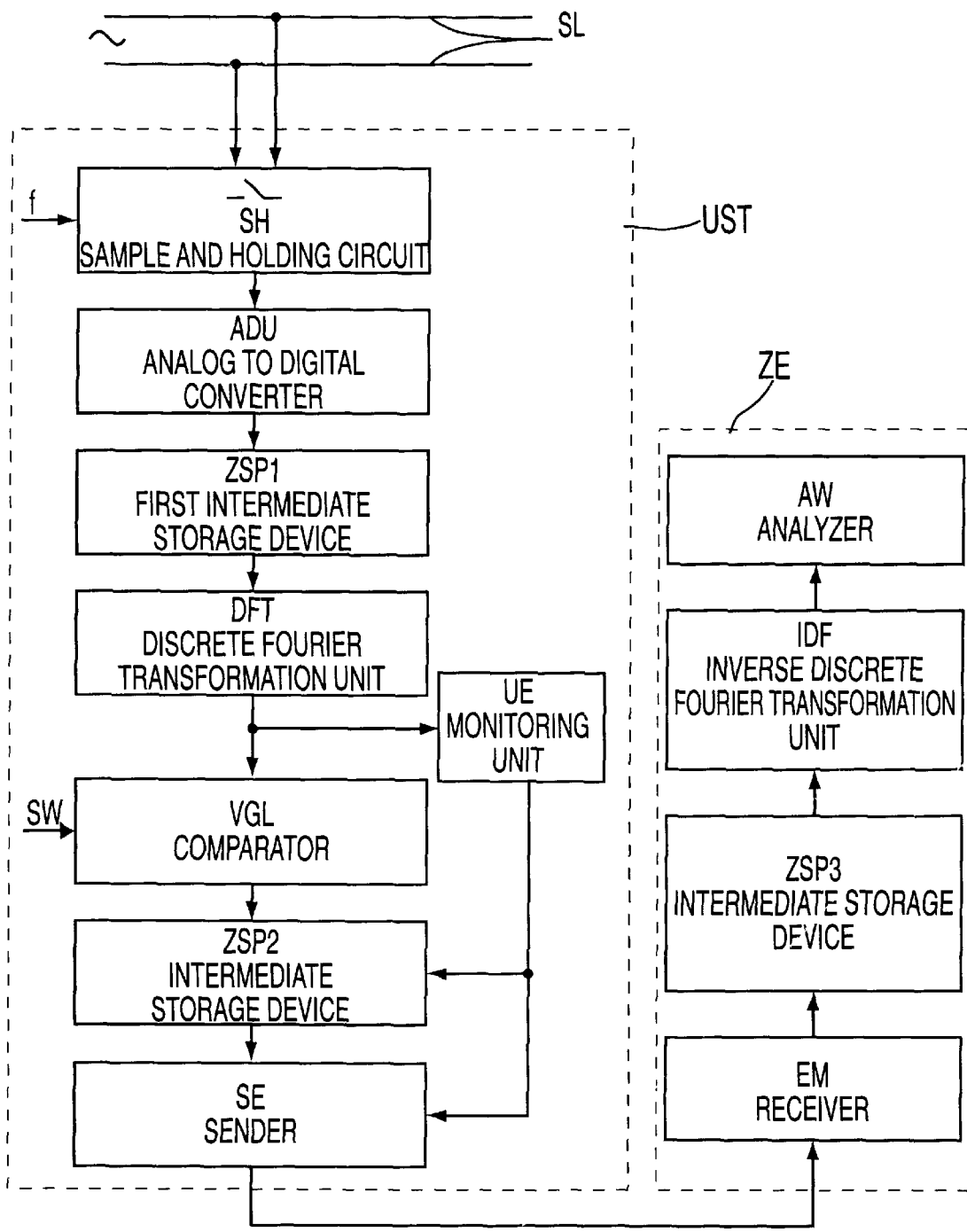
FIG. 1 is a schematic representation of an embodiment of a system in accordance with the present invention.

In FIG. 1, the voltage of an AC line SL is to be monitored for faults. In general, not only a single-phase voltage is monitored, but also multiphase voltages and currents, for which a plurality of channels is required. The description of a single channel is, however, sufficient for explaining the invention. Therefore FIG. 1 shows a single channel of a substation UST.

A sampling and holding circuit SH samples the voltage of line SL with a frequency f, which is an integer multiple of the frequency of the monitored voltage, in general, the network frequency, for example 5 Khz. The sampling values are digitized by an analog-digital converter ADU and entered in a first intermediate storage device ZSP1. There they are combined to form data sets of consecutive sampling values spanning one or more periods of the network voltage. In the exemplary embodiment, 500 data sets spanning five periods are used. In general, no fixed sampling rate can be used, but the sampling rate is preferably synchronized with the network frequency. At high sampling rates, it may remain constant. Then, however, the number of data sets is variable, so that they always span an integer multiple of the network voltage period. The data sets are individually subjected to a Discrete Fourier Transformation in a DFT unit. Such a transformation is well-known from communications technology, for example, from Norbert Hesselmann's book "Digitale Signalverarbeitung" [Digital Signal Processing], 1983, Vogel-Verlag, pp. 113–117, and therefore does not need to be explained in detail here. From the 500 sampling values, the discrete Fourier transformation unit obtains 250 complex spectral values in the frequency range. The amplitudes of the spectral values are compared in a comparator VGL with a threshold value SW, which is 0.05% of the largest amplitude, for example. In any case, the threshold value must be of such a size that virtually no information regarding the variation of the voltage is lost by data compression. The amplitudes of the complex spectral values are obtained, in a well-known manner, by calculating the square root of the sum of squares of the real and imaginary parts. The spectral values whose amplitudes are less than this threshold value are set to zero, i.e., suppressed; the larger spectral values are entered in a second intermediate storage device ZSP2.

In the exemplary embodiment, the DFT unit converts the sampling values into spectral values on a continuous basis, at a rate with which the sampling values are entered in intermediate storage device ZSP1. The storage device ZSP1 is therefore dimensioned so that it can store two data sets so that while the sampling values of one data set are being entered, the second data set is processed in the DFT unit and in comparator VGL. The intermediate storage device ZSP2 is dimensioned so that it can accommodate at least the spectral value data sets with which the previous history of a fault can be described. In general, however, it is dimensioned so that it can store the data sets of a fault including its previous and subsequent history. In the assumed example of a sampling frequency f of 5 Khz and 500 sampling values per data set, 50 data sets are required to describe the 5-second previous history, which is the minimum that must be accommodated by intermediate storage device ZSP2. In normal operation, if no fault has occurred, the latest 50 data sets are contained in intermediate storage device ZSP2, with the oldest one being constantly replaced by the most recent one. If a fault occurs, these 50 data sets, as well as the subsequent data sets of the fault and after the fault, are transferred by a sender SE to a receiver EM of a central unit ZE, where they are entered by receiver EM in an intermediate storage device ZSP3. An IDF unit reconstructs the sampling values from the data sets using an inverse discrete Fourier transformation, which is also known from the book "Digitale Signalverarbeitung." The reconstructed sampling values are analyzed in an analyzer AW.

Figure 2:
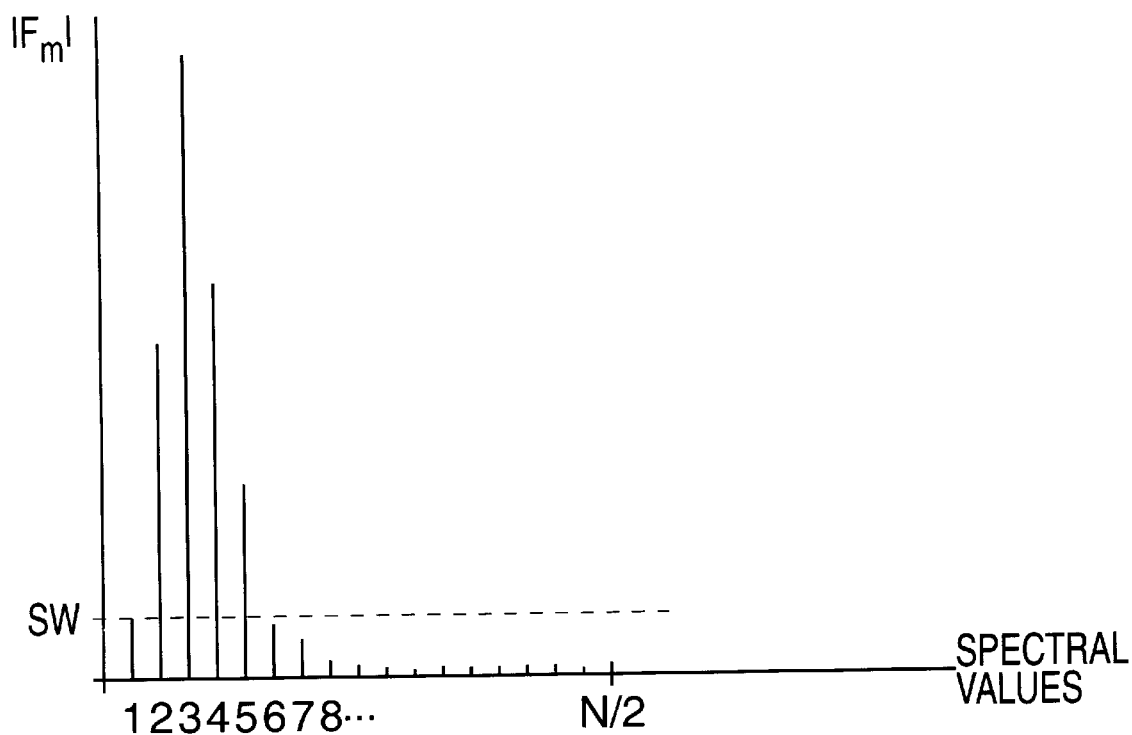
FIG. 2 shows spectral values of a data set when there is no fault present.

FIG. 2 shows the spectral values of a data set when there is no fault present. The abscissas represent numbers 1, 2, . . . N/2, of the spectral values with N being the number of sampling values per data set. Since, as mentioned before, only one-half of the spectral values are independent of one another, it is sufficient to process these only. In the normal case represented here, only a few spectral values are of a non-negligible size. The other, smaller spectral values arise, at least in part, from transmission errors, quantification noise, and the like. Therefore a threshold value SW is introduced; values smaller than this are suppressed and only those that are larger are processed further. They can be denoted with consecutive numbers 1, 2, 3, . . . 250, with which they can be identified when the sampling values are reconstructed.

Figure 3:
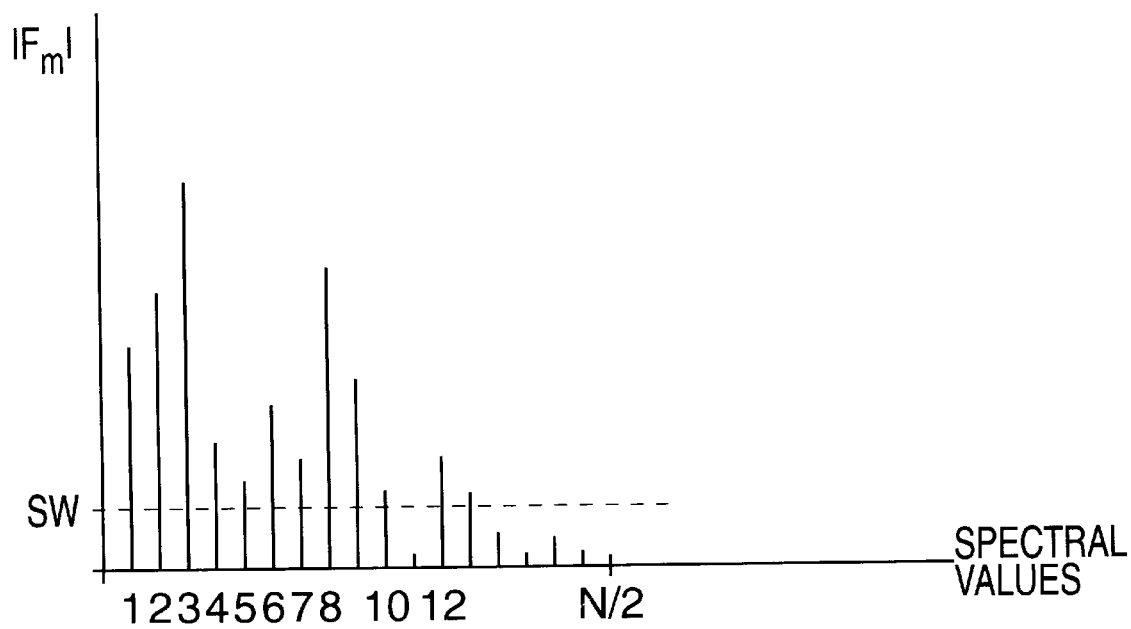
FIG. 3 shows the spectral values of a data set in the event of a fault.
Figure 4:
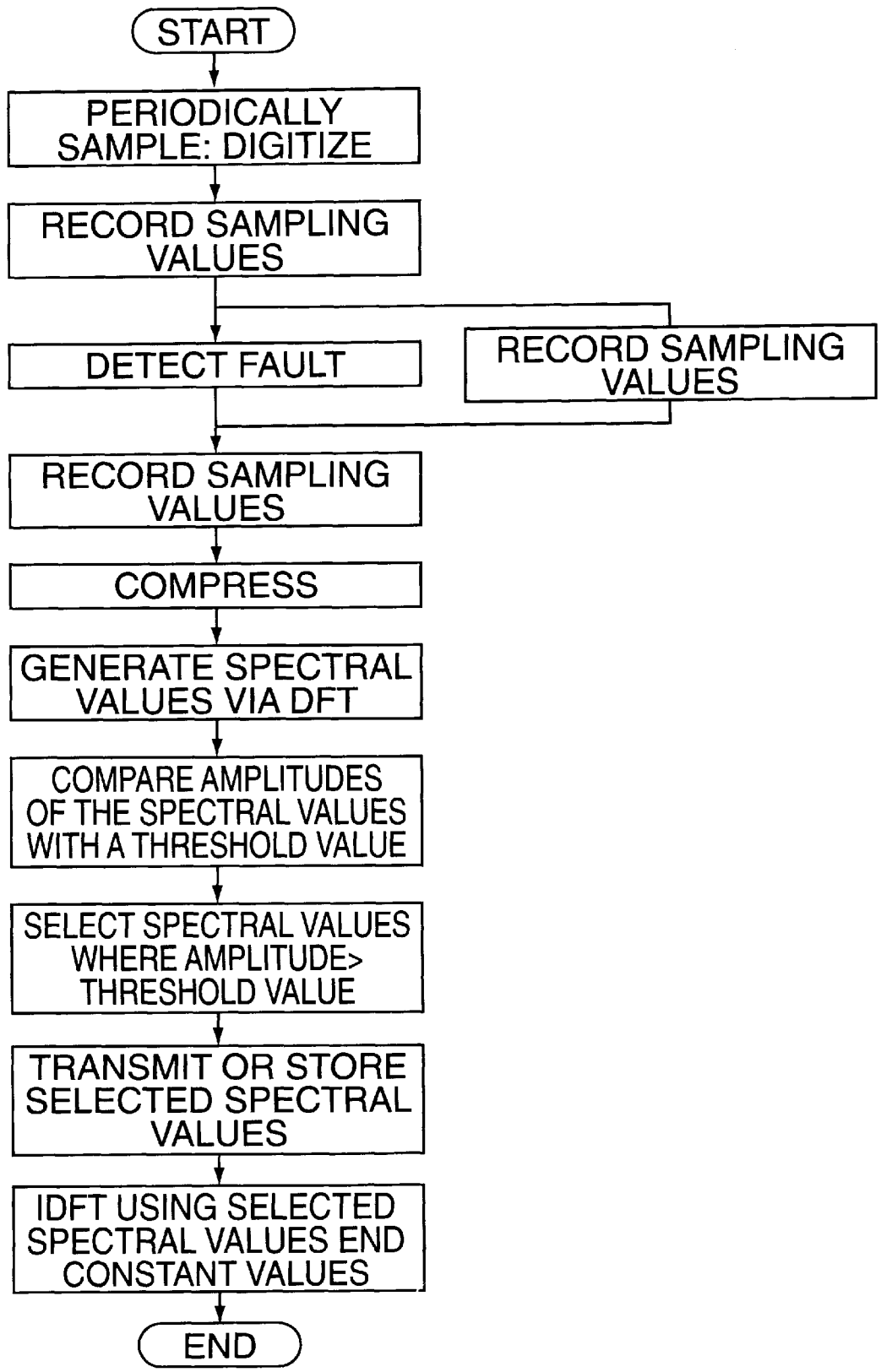
FIG. 4 shows a method corresponding to the operation of the system of FIG. 1.

FIG. 3 shows the spectral values of a data set in the event of a fault. The number of spectral values exceeding threshold value SW is considerably greater than in the normal case shown in FIG. 2. The data reduction is therefore smaller. Since, however, the previous and subsequent history are long compared to the duration of the fault, a still considerable overall data reduction of 50:1 is obtained.

Faults are usually recognized by comparing the sampling values of successive periods of the voltage or current monitored. If the deviations from one period to another exceed a predefined amount, it is considered a fault and the data sets of the previous history, the fault, and the subsequent history are stored and/or transmitted to a central unit. In the exemplary embodiment shown, faults are recognized with the help of the frequency spectrum. For this purpose, the spectral value data sets are supplied to a monitoring unit UE. They can be obtained directly from the DFT unit, but also from comparator VGL, or from intermediate storage device ZSP2. The appearance of spectral values of higher order, e.g., higher than 6th order, or the ratio of higher-order spectral values to the spectral values appearing when no fault is present, or also the ratio of the sum of all spectral values to the sum of lower-order spectral values can be used as criteria. Since changes in the amplitude should also be reported as faults when monitoring network voltages, the change in amplitude of lower-order spectral values can also be a fault criterion. If the monitoring unit UE has detected a fault, it sends a telegram describing the previous history, the fault itself, and the subsequent history to intermediate storage device ZSP2, and then issues a send command to sender SE.

Since all the complex spectral values (in the example 250) are required for the inverse discrete Fourier transformation, the spectral values received in the IDF unit of the central unit ZE are supplemented by the constant values suppressed by comparator VGL, which are smaller than the threshold value, in the simplest case by assuming that they are equal to zero.

What is claimed is:

1. A method for monitoring a power supply network comprising the steps of:

periodically sampling and digitizing at least one of a voltage and a current to generate sampling values;

detecting a fault;

recording a number of sampling values before, during and after the fault;

compressing the number of recorded sampling values;

generating spectral values from an integer multiple of the number of recorded sampling values using a discrete Fourier transformation;

comparing amplitudes of the spectral values with a threshold value;

selecting those spectral values whose amplitudes are greater than the threshold value;

transmitting or storing the selected spectral values;

replacing those spectral values whose amplitudes are not greater than the threshold value with constant values that are smaller than the threshold value; and performing an inverse discrete Fourier transformation using the selected spectral values and the constant values.

2. The method of claim 1, wherein spectral values that are independent of one another are transmitted or stored.

3. A monitoring device for monitoring a power supply network, the monitoring device comprising:

a detection device which generates sampling values by periodically sampling at least one of a voltage and a current of the power supply network;

a transformation device which generates spectral values, using a discrete Fourier transformation, from an integer multiple of a number of sampling values spanning a network period, which sampling values are recorded before, during and after a fault;

a data compression device for compressing the spectral values by comparing the spectral values to a threshold value and suppressing those spectral values whose amplitudes are less than the threshold value;

a transmission device for transmitting to a receiving device those spectral values whose amplitudes are greater than or equal to the threshold value; and a data decompressing device for decompressing the transmitted spectral values, wherein the data decompressing device calculates sampling values from the transmitted spectral values using an inverse discrete Fourier transformation, and wherein the decompressing device substitutes constant values that are less than the threshold value for those spectral values suppressed by the data compression device.

* * * * *